(12) United States Patent
Diril et al.

(10) Patent No.: US 9,761,303 B2
(45) Date of Patent: Sep. 12, 2017

(54) STORAGE ELEMENT WITH MULTIPLE CLOCK CIRCUITS

(71) Applicant: Apple Inc., Cupertino, CA (US)

(72) Inventors: Abdulkadir U. Diril, Mountain View, CA (US); Adam T. Moerschell, San Jose, CA (US); Anthony P. DeLaurier, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/009,200

(22) Filed: Jan. 28, 2016

(65) Prior Publication Data

US 2017/0221550 A1 Aug. 3, 2017

(51) Int. Cl.
*G11C 11/00* (2006.01)
*G11C 11/419* (2006.01)

(52) U.S. Cl.
CPC .................. *G11C 11/419* (2013.01)

(58) Field of Classification Search
CPC ... G11C 11/419; G11C 7/1051; G11C 7/1078; G11C 11/412; G11C 11/413
USPC .................. 365/154, 233.1, 233.11
See application file for complete search history.

(56) References Cited

U.S. PATENT DOCUMENTS

| | | | |
|---|---|---|---|
| 5,842,005 A | 11/1998 | Walsh et al. | |
| 6,839,859 B2 * | 1/2005 | Kouchi | G11C 7/1045 327/141 |
| 7,590,016 B2 * | 9/2009 | Ishikawa | G11C 29/14 365/189.05 |
| 8,434,047 B1 | 4/2013 | Jiang et al. | |
| 9,026,980 B1 | 5/2015 | Milton et al. | |
| 2015/0022252 A1 | 1/2015 | Venas | |

OTHER PUBLICATIONS

Jagrit Kathuria, et al., "A Review of Clock Gating Techniques," MIT International Journal of Electronics and Communication Engineering, vol. 1, No. 2, Aug. 2011, pp. 106-114.

* cited by examiner

*Primary Examiner* — Tha-O H Bui
(74) *Attorney, Agent, or Firm* — Meyertons, Hood, Kivlin, Kowert & Goetzel, P.C.

(57) ABSTRACT

Techniques relating to providing clock signals to a storage element. Generally, different portions of a given storage element may be clocked according to different schemes. This technique may be pertinent to a storage element that has a portion for which the associated bit values do not change frequently relative to another portion of the storage element. For such a storage element, a high-frequency portion may be clocked upon an access to the storage element, while a low-frequency portion may be clocked only if there is a change in the associated bit values. This technique can be applied to various storage elements, including registers and FIFO buffer entries. An apparatus may be designed such that the low-frequency and high-frequency portions of a storage element do not change during operation. Alternatively, the low-frequency and high-frequency portions of the storage element may be changeable based on a current operating mode of the apparatus.

20 Claims, 12 Drawing Sheets

STORAGE ELEMENT WITH MULTIPLE CLOCK CIRCUITS

BACKGROUND

Technical Field

This disclosure relates generally to computer storage elements, and more specifically to techniques for providing clock signals to these elements.

Description of the Related Art

Power associated with clock switching is typically a significant contributor to dissipated power in microprocessors and other types of integrated circuits. Clock gating is one technique used in many circuits for reducing dynamic power dissipation. Clock gating saves power by adding more logic to a circuit to prune the clock tree. Pruning the clock tree disables portions of the circuitry so that elements in them, such as flip-flops, do not have to switch states when not necessary. Switching states consumes power. When not being switched, the switching power consumption for a circuit element being clock gated may approach zero. Various techniques exist for performing clock gating.

SUMMARY

Structures and techniques are disclosed for clocking a storage element within a computing system using multiple different clocking schemes. In certain embodiments, an apparatus according to the present disclosure includes a storage element that is collectively configured to store a value as a plurality of bit values in respective ones of a plurality of storage circuits, each of which is configured to receive a respective clock input that enables a bit value to be written to that storage circuit. The apparatus further includes a first clock circuit and a second clock circuit which provide respective clock signals to first and second groups of storage circuits within the storage element. The first clock circuit is configured to receive an input clock signal and generate a first output clock signal according to a first set of criteria and provide the first output clock signal to the clock inputs of storage circuits in the first group. Conversely, the second clock circuit is configured to receive the input clock signal and generate a second output clock signal according to a second set of criteria that differs from the first set of criteria. The second clock circuit is configured to provide the second output clock signal to the clock input of one or more storage circuits in the second group.

Such embodiments advantageously allow the clock inputs of a storage element (such as a register or buffer entry or other suitable structure) at a finer level of granularity than simply clocking all storage circuits (e.g., flip-flops) within the storage element using the same clocking scheme. It may be recognized during the design process that certain bits in a particular storage element change at different frequencies. For example, it may be the case that the upper bits in a register change much more slowly over time than the lower bits of the register. Thus, the upper bits might be said to constitute a "low-frequency" component or portion of the register, while the lower bits constitute a "high-frequency" component or portion. In this scenario, the lower bits of the register may be clocked according to a first set of criteria (e.g., provide a clock signal to these upper bits upon a write operation to the register), while the upper bits of the register may be clocked according to second, different set of criteria (e.g., provide a clock signal to these lower bits on a write operation to that changes the contents of at least one of the lower bits; or provide a clock to those ones of the lower bits whose contents are changed by the write operation).

One specific use case is a register that holds a current pixel coordinate value for a circuit that operates on a "window" or region of pixels at a time. The bits of the register that are used to address locations within a particular pixel window (e.g., the lower-order n bits, where the size of the pixel window may be $2^n$) may be clocked differently than the bits of the register that are used to identify a particular pixel window (e.g., the upper m bits of the register, where the register is m+n bits wide). Of course, the present disclosure is by no means limited to this particular use case. On the contrary, this disclosure is intended to apply to various types of storage elements, used for any suitable purpose.

In some embodiments, the composition of various portions of a storage element that are clocked using respective, different clocking schemes according to the present disclosure may be fixed by the design. In other embodiments, the composition of these portions may be changed during operation—for example, according to a current operating mode. Accordingly, the composition of first and second groups of storage circuits within a storage element may change dynamically. For example, during a first operating mode, first and second groups may be clocked, respectively, using first and second clocking schemes. During a second operating mode the first and second groups may continue to be clocked using these respective clocking scheme, but the composition of what storage circuits are in the first and second groups has changed relative to the first operating mode. Thus, a particular storage circuit may be clocked according to a first clocking scheme during a first operating mode and according to a second clocking scheme during a second operating mode. Such embodiments may be useful for situations in which a storage element stores different types of data, various ones of which may have different frequency characteristics for constituent bit locations.

Figure 1:
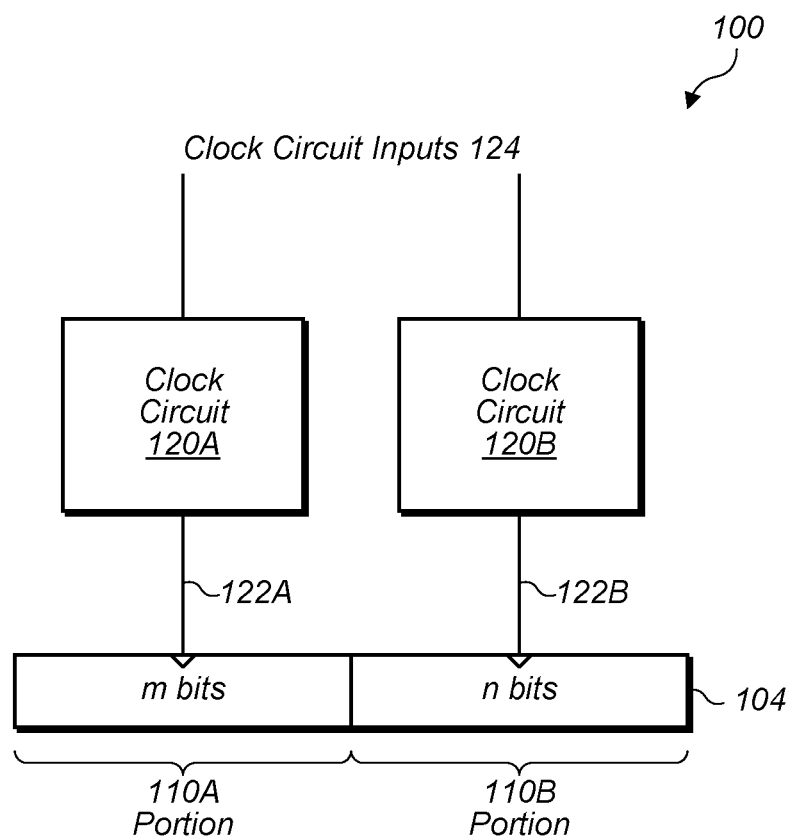
FIG. 1 is a block diagram illustrating an exemplary storage element coupled to two different clock circuits, according to some embodiments.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims that a structure is "configured to" perform one or more tasks is expressly intended not to invoke 35 U.S.C. §112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

DETAILED DESCRIPTION

This disclosure describes techniques for reducing circuit power consumption by utilizing two (or more, in some cases) different clock circuits for a storage element (e.g., a register or buffer entry). Broad embodiments of this concept are described with reference to FIGS. 1 and 2. An exemplary clock circuit is discussed with reference to FIG. 3. An exemplary computing system that implements such techniques for a register is shown with reference to FIG. 4, while an exemplary computing system that implements such techniques for a buffer entry is shown with reference to FIGS. 5 and 6. Further details relating to operation of an exemplary buffer are described with reference to FIG. 7. Embodiments of a system that allows dynamic modification of clocking schemes for portions of a storage element are described with reference to FIGS. 8-10. An exemplary method for clocking a storage element is described with reference to FIG. 11. Finally, an exemplary context within which the disclosed techniques can be used is described with reference to FIGS. 12A and 12B.

Referring now to FIG. 1, a block diagram of an exemplary portion of a computing system 100 is depicted. In the illustrated embodiment, system 100 includes a storage element 104, which includes portion 110A (composed of m bits) and portion 110B (composed of n bits). Storage element thus has m+n bits in the depicted embodiments, where m and n are each greater than or equal to one. Clock circuit 120A provides output clock signal 122A to a clock input of portion 110A, while clock circuit 120B provides output clock signal 122B to a clock input of portion 110B. Clock circuits 120 receive inputs that are referred to in FIG. 1 as clock circuit inputs 124. In some embodiments, clock circuits 120 may share one or more inputs 124 such as a common input clock signal.

As used herein, a "storage element" refers to a circuit in a computing system that includes a plurality of component storage circuits (e.g., flip-flops), each configured to storage a group of bit values that collectively constitute a value usable by the computing system. (Each storage circuit may store one or more bits in various embodiments.) A storage element is some group of storage circuits that is addressable or otherwise accessible by computing system 100 as a unit. For example, in various embodiments, storage element 104 might be a register, an entry in some larger structure such as a buffer, etc. A plurality of storage circuits in one register of a register file, amalgamated with a plurality of storage circuits in another register of the register file, however, does not constitute a storage element within the meaning of this disclosure. (Each of these register would individually constitute a storage element within the meaning of this disclosure, however.)

Clock circuits 120 correspond to any circuit that is configured to produce an output clock signal 122, which is then provided to the corresponding portion 110 of storage element 104. Examples of clock circuits 120 are discussed below, including with reference to FIGS. 3 and 4. In various embodiments, clock circuits receive, as inputs, clock circuit inputs 124. In different embodiments, inputs 124 may be the same for each clock circuit 120. In other embodiments, certain ones of inputs 124 may be shared by clock circuits 120A and 120B. In still further embodiments, inputs 124 may be separate for clock circuits 120 (that is, there are no shared inputs). As will be discussed with reference to FIG. 3, exemplary inputs 124 include an input clock signal and an enable signal. Output clock signals 122 may each be composed of one or more different clock signals. Thus, in some embodiments, output clock signal 122 may be a single clock signal conveyed to each storage circuit within corresponding portion 110 of storage element 104. On the other end of the spectrum, each storage circuit within a portion 110 may receive its own output clock signal 122, such that each storage circuit may be clocked (or not clocked, as the case may be) separately. In other embodiments, a group of storage circuits within a portion may each receive the same output clock signal 122, while other storage circuits within that portion may receive their own (separate) output clock signal 122.

FIG. 1 illustrates the idea that different portions of storage circuits within a storage element (e.g., different bit portions) of a storage element may be clocked using (at least) two different clocking criteria. Specifically, storage element 104 includes a plurality of storage circuits (not depicted in FIG. 1, but shown with reference to later figures). These storage circuits each store a bit value of one or more bits; collectively, these bit values constitute a value of the storage element. Each of the plurality of storage circuits is configured to receive a respective clock input that enables a bit value to be written to that storage circuit. In the illustrated embodiment, these clock inputs to the storage circuits correspond to output clock signals 122 produced by clock circuits 120.

In various embodiments, clock circuits 120 are configured to generate output clock signals 122 according to two different sets of criteria. For example, in computing system 100, clock circuit 120A is configured to generate output clock signal 122A according to a first set of criteria and provide signal 122A to a first group of the plurality of storage circuits in storage element 104, denoted by portion 110A in FIG. 1. Similarly, clock circuit 120B is configured to generate output clock signal 122B according to a second, different set of criteria and provide signal 122B to a second group of the plurality of storage circuits in storage element 104, denoted by portion 110B. As shown, portions 110A and 110B do not overlap, such that the storage circuits that are in portion 110B are not also in portion 110A. Note that all references in this disclosure to "groups" or "portions" of a storage element are intended to non-overlapping groups or portions. That is, when the present disclosure refers to first and second groups of storage circuits, no storage circuit in the first group is also in the second group, and vice-versa.

A single portion or block of an integrated circuit that produces two (or more) sets of output clock signals according to different criteria constitutes first and second clock circuits for purposes of this disclosure. In other words, a single circuit that produces two different sets of output clock signals according to two different sets of criteria is intended to fall within the scope of FIG. 1. One example of different clocking criteria is discussed below, including with reference to FIG. 2. Note that while only two clock circuits are shown in FIG. 1, the illustrated concept can be extended to more than two clock circuits, such that three or more portions of storage element 104 each have corresponding clock circuits. An example of such a configuration is described with reference to FIGS. 8-10.

By making the first and second sets of criteria different, the relevant portion of computing system 100 may achieve reduced power consumption by allowing clock inputs to a storage element to be controlled at more granular level than clocking (or not clocking) the entire storage element 104 as a monolithic entity. In embodiments having the illustrated configuration, for example, portion 110A may be clocked upon an access to storage element 104, while at least some part of portion 110B is not clocked for the same access. Further, the second set of criteria implemented by clock circuit 120B may, in some instances, be such that different storage circuits within portion 110B are clocked upon different accesses to storage element 104.

Figure 2:
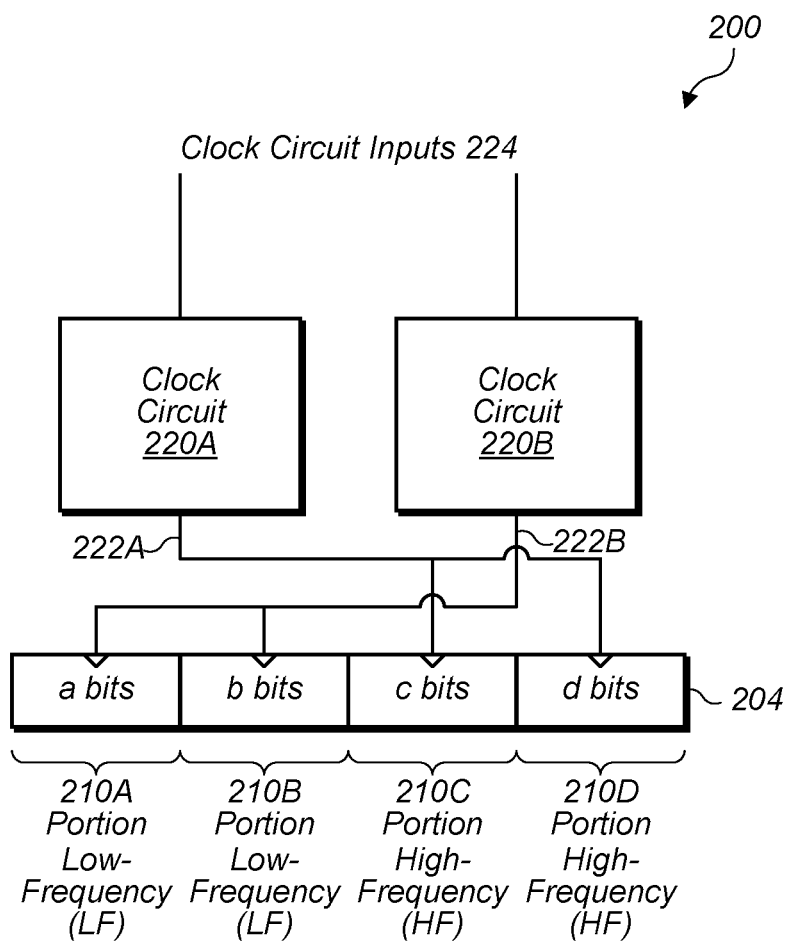
FIG. 2 is a block diagram illustrating an exemplary storage element having high-frequency and low-frequency portions, each of which is coupled to a respective clock circuit, according to some embodiments.

Referring now to FIG. 2, a particular implementation of the broad concept outlined with reference to FIG. 1 is now described. FIG. 2 depicts a block diagram of a portion of an exemplary computing system 200. As shown, computing system 200 includes elements similar to those depicted in FIG. 1, namely storage element 204 having portions 210A-D, clock circuits 220A-B, and clock circuit inputs 224. The discussion of these elements provided with respect to FIG. 1 also applies to FIG. 2.

As shown, clock circuit 220A provides output clock signal 222A to portions 210C, and 210D, which are designated as "high-frequency," or HF. Clock circuit 220B, on the other hand, provides output clock signal 222B to portions 210A and 210B, which are designated as "low-frequency," or LF. As used herein, the terms "high-frequency" and "low-frequency" are not intended to refer to any specific numerical frequency threshold. Instead, these terms denote the relative frequency with which certain bit values within storage element 204 change. Further, bit values in the high-frequency and low-frequency portions 210 are clocked according to different sets of criteria.

As an example, suppose that storage element 204 is configured to store a value used to address a memory, and that computing system 200 is configured to operate on a particular region or regions of that memory for a relatively long period of time, with the value stored in element 204 changing during each successive access to the memory region(s). In such a scenario, it may be the case that while computing system 200 is operating on the particular memory region(s), bit values in a certain portion of storage element 204 may not change very frequently. It may be the case, for instance, that while operating on the memory region(s), the bit values in portion 210A-B do not change very quickly (or at all) during successive accesses, while bit values in portions 210C-D tend to change much more frequently.

The present inventors have recognized that a split clocking paradigm may be advantageously applied to a storage element having both high-frequency and low-frequency portions. Thus, the high-frequency portions may be clocked according to a first set of criteria, while the low-frequency portions may be clocked according to a second, different set of criteria. For example, in various embodiments, the high-frequency portions may be clocked in response to control signals indicating an access to storage element 204 (e.g., an enable signal coupled with an input clock signal 224), while the low-frequency portions may be clocked only if a value of an individual storage circuit is being changed (i.e., a current value of the individual storage circuit is different from an incoming value to that circuit). Storage circuits within the low-frequency portions may thus be clock gated in some instances. Such an approach may allow, for example, the clock gating of the upper bits of a storage element, although in various embodiments, any portion of a storage element may be selectively clocked as desired. Embodiments that perform such clock gating are described further at length below.

As noted above, the terms "high-frequency" and "low-frequency" do not have any specific numeric values. Rather, in some cases, these portions of a given storage element may be designated by a designer of computing system 200 based on expected circuit operation. Alternately, the high- and low-frequency portions may be designated based on the results of simulations. Thus, in some situations, the circuit portions designated as high- or low-frequency may not actually exhibit that behavior. Whatever the basis for designating storage element portions as high- or low-frequency, configurations such as those shown in FIG. 2 will utilize different clocking schemes for those portions. This approach allows potential power savings, for example, by not having to clock portions of a storage element when the bit values in those portions do not change for some length of time. It can be easily seen that the potential power savings may increase with the relative size of the low-frequency portion of a given storage element, particularly for large-width storage elements.

Having described a general approach to split clocking within a given storage element, an exemplary clock circuit is now discussed with reference to FIG. 3. That figure depicts an exemplary clock circuit 300 according to some embodiments. Generally speaking, clock circuit 300 receives an input clock signal 302 and produces an output clock signal 312 based on an associated control signal, enable (EN) signal 304. As depicted, clock circuit 300 includes a latch 310 and an AND gate 308. Latch 310 receives enable (EN) signal 304 and an inverted version of an input clock signal (CLK) 302. Clock circuit 300 will buffer CLK signal 302 when EN signal 304 is asserted. Conversely, clock circuit 300 will gate CLK signal 302 when EN signal 304 is not asserted, such that the output of AND gate 308, gated CLK signal 312, is not active. Clock circuits such as circuit 300 may be implemented using various circuit topologies; clock circuit 300 is shown for illustrative purposes only and is not intended to limit the scope of the present disclosure. For example, in other implementations, gated CLK signal 312 may stay high instead of low when the EN signal is not asserted. Similarly, a disable signal may be used as an input instead of an enable signal, etc. Multiple ones of clock circuit 300 may be used in some embodiments as a building block to implement the split clocking scheme described above.

Figure 4:
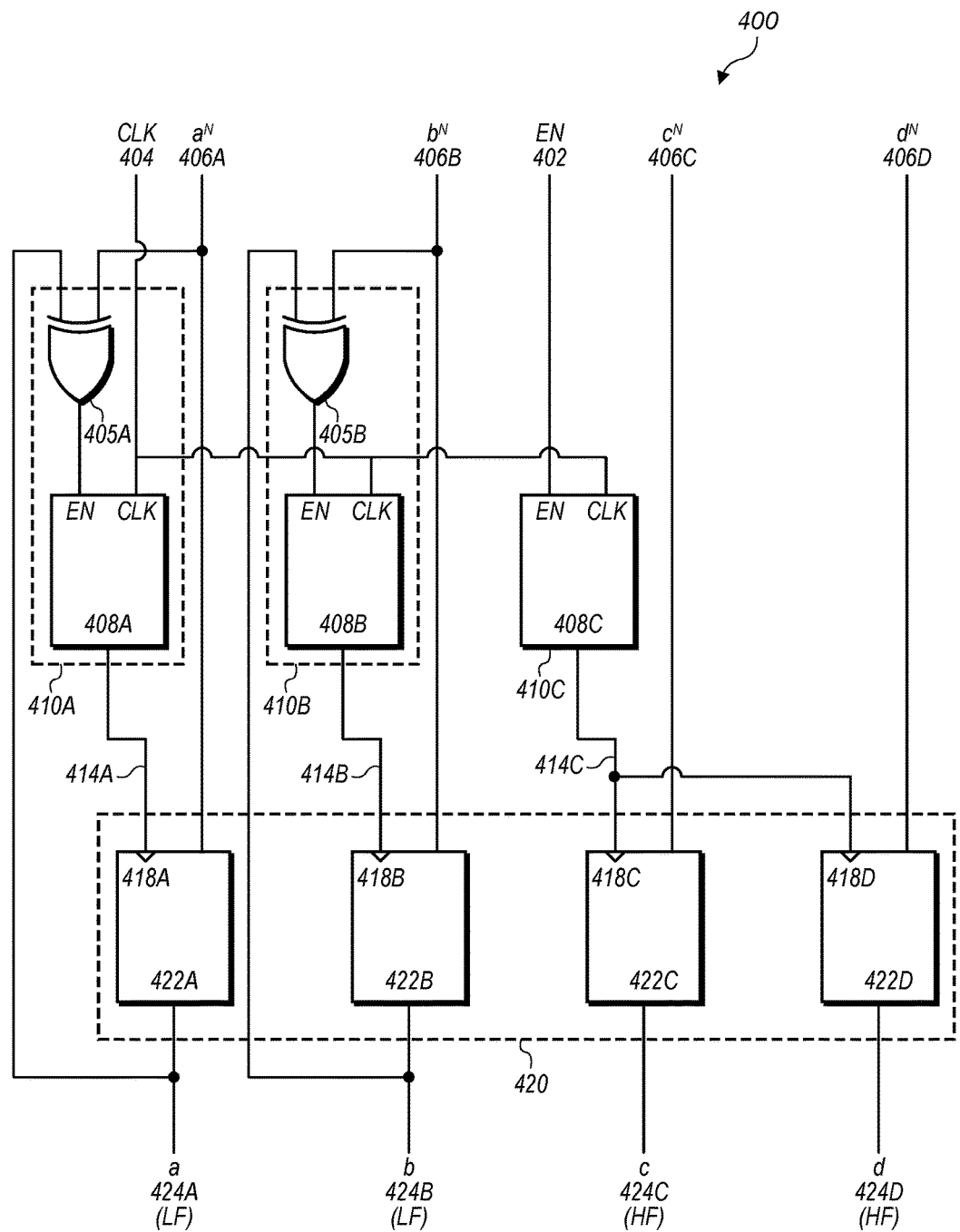
FIG. 4 is a block diagram of an exemplary storage element coupled to two different clock circuits, according to some embodiments.

Referring now to FIG. 4, a block diagram of an exemplary computing system 400 is shown. The illustrated embodiment includes a storage element 420, which may be a register in some embodiments. In other embodiments, storage element 420 may be a buffer or other temporary storage. In FIG. 4, storage element 420 is illustrated as having four storage circuits 422A-D. Storage circuits 422 may be flip-flops, for example. Storage circuits 422 each store a single bit value in FIG. 4, although in other embodiments, storage circuits 422 may store multi-bit values. In different embodiments, of course, storage element 420 may have a different number of bits.

Storage circuits 422 each include a clock input 418, which is configured to receive an output clock signal 414 from clock circuits 410. As shown, clock circuit 410A provides output clock signal 414A to clock input 418A of storage circuit 422A. Similarly, clock circuit 410B provides output clock signal 414B to clock input 418B of storage circuit 422B. Clock circuit 410C provides output clock signal 414C to both clock inputs 418C and 418D of storage circuits 422C and 422D.

The current contents of storage circuits 422 are denoted by the letters a-d, as well as corresponding reference numerals 424A-D. New bit values to be written to storage circuits 422 are conveyed on bit input lines 406A-D. These bit values are denoted as $a^N$, $b^N$, $c^N$, and $d^N$, where the "N" indicates a "next" bit value. As indicated, storage circuits 422A and 422B constitute the low-frequency portion of storage element 420, while storage circuits 422C and 422D constitute the high-frequency portion of that element. As described above with reference to FIG. 2, each of these storage element portions has a different clocking scheme in certain embodiments.

Storage circuits 422 in the high-frequency portion of storage element 420 receive output clock signal 414C from clock circuit 410C. As shown, clock circuit 410C, which includes circuit element 408C, receives as inputs enable signal (EN) 402 and input clock signal (CLK) 404. In some embodiments, clock circuit 410C can operate in a manner similar to clock circuit 300 described above with reference to FIG. 3, such that CLK signal 404 is buffered when EN signal 402 is activated (high or low, as the case may be).

Similarly, clock circuits 410A and 410B each include a circuit element 408A and 408B, which may operate similarly to element 408C. The EN inputs to elements 408A and 408B, however, are coupled to XOR gates 405A and 405B. Each XOR gate receives as its inputs the current and next values of its corresponding storage circuit 422. For example, XOR gate 405A receives as bit values a (424A) and $a^N$ (406A). Given the truth table for the XOR function, clock circuits 410A and 410B are enabled when its current and next bit values are different, and disabled when the current and next bit values are the same. (Note that, in some embodiments each output of XOR gates 405 may be ANDed with EN signal 402, with the output of the AND gate being provided to the EN input of its respective clock circuit 408.)

Accordingly, clock circuit 410C is configured to cause output clock signal 414C to be provided to each of a first group of storage circuits (i.e., storage circuits 422C and 422D) in response to a write operation to storage element 420. Thus, in embodiments having the configuration of FIG. 4, when a control signal such as EN signal 402 is activated for a write operation, clock circuit 410C will cause output clock signal 414C to be provided to storage circuits 422C and 422D. In contrast, clock circuit 410A is configured to cause output clock signal 414A to be selectively provided to a particular storage circuit (i.e., storage circuit 422A) in response to a write operation to storage element 420. In other words, the fact there is a write operation occurring does not mean that storage circuit 422A will actually be clocked (and therefore potentially updated). (Clock circuit 410B and storage circuit 422B behave similarly.) Thus, in the configuration of FIG. 4, the low-frequency portion of storage element 420 will be clocked only under a specified set of criteria—namely, that there is an active enable signal and the current and next values of storage circuits 422A and 422B are different. The high-frequency portion of storage element 420, on the other hand, will be clocked under a different set of criteria—when enable signal 402 is activated. In the exemplary configuration of FIG. 4, the high-frequency portion of storage element 420 is thus clocked upon each write operation, while the low-frequency portion is clock gated, such that it is clocked only on write operations that cause a change in bit value. This arrangement may result in reduced power dissipation for storage element 420. This power savings may be relatively significant in instances in which storage element 420 has a large number of bits and a large portion of those bits can be characterized as low frequency.

As previously noted, storage element 420 is not limited to any specific type of storage element. Thus, for example, storage element 420 may be a register, a buffer, or any other suitable type of multibit storage. Additionally, storage element 420 may be a standalone storage element or one that is part of some larger logical structure. An example of the latter scenario is discussed next with reference to FIG. 5.

Figure 5:
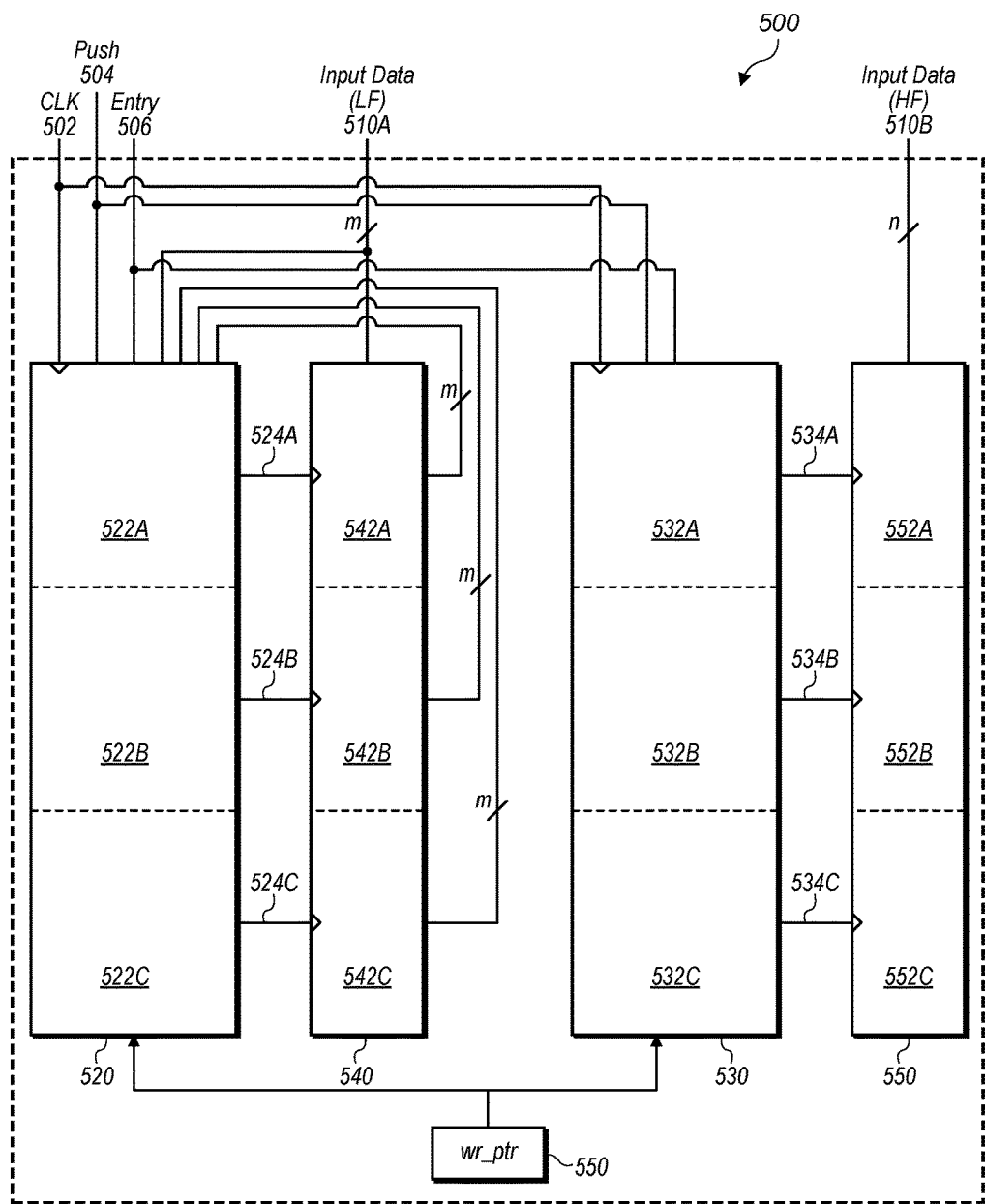
FIG. 5 is a block diagram of a first-in, first-out (FIFO) buffer having high-frequency and low-frequency portions and associated clock circuits, according to some embodiments.

Referring now to FIG. 5, a block diagram is shown for a buffer 500 having multiple entries. Within the context of FIG. 5, buffer 500 is implemented as a first-in, first-out (FIFO) buffer, but in other embodiments, different buffer schemes can be utilized (e.g., last-in, first-out, or LIFO). In various embodiments, entries in buffer 500 have at least two portions. Accordingly, the apparatus depicted in FIG. 5 includes a first-in, first-out (FIFO) buffer 500 having a plurality of entries, each having a first portion and (542, composed of entries 542A-C) a second portion (552, composed of entries 552A-C). A particular storage element within buffer 500 may be updated on a given access. The first and second portions of the particular storage element respectively include a first group of storage circuits and a second group of storage circuits, neither of which are pictured.

Embodiments having a configuration such as that illustrated in FIG. 5 may be characterized in some instances as having both high-frequency and low-frequency portions. Thus, a given entry in buffer 500 is split between a low-frequency portion 542 and a high-frequency portion 552. For example, in a 32-bit buffer implementation, a particular buffer entry may be comprised by low-frequency portion 542B and high-frequency portions 552B. In one specific instance, portion 542B may store the upper 8 bits of the buffer entry, while portions 552C may store the lower 24 bits of the entry.

The low-frequency portions of buffer 500 may be collectively referred to as low-frequency storage, which is indicated by reference numeral 540 in FIG. 5. Similarly, the high-frequency portions of buffer 500 may be collectively referred to as high-frequency storage, which is indicated by reference numeral 550. Each portion of buffer 500 has its associated clock circuit. Thus, low-frequency storage 540 is associated with low-frequency clock circuit 520, while high-frequency storage 550 is associated with high-frequency clock circuit 530. Each of storage portions 540 and 550 is configured to receive input data 510, which corresponds to a value being written to an entry in buffer 500 in various embodiments. As depicted, input data 510 includes a low-frequency portion 510A, which is provided to low-frequency storage 540, and a high-frequency portion 510B, which is provided to high-frequency storage 550. Note that, in the configuration of FIG. 5, low-frequency input data 510A is also provided to low-frequency clock circuit 520, but high-frequency input data 510B is not provided to high-frequency clock circuit 530. This arrangement indicates that operation of low-frequency clock circuit 520 may depend, in some instances, on the content of input data 510A, while the operation of high-frequency clock circuit 530 does not depend on the content of input data 510B. This configuration is thus another example of employing multiple clocking schemes for a given storage element.

Low-frequency clock circuit 520 includes, in the configuration illustrated in FIG. 5, individual low-frequency clock circuit elements 522A-C. Each of clock circuit elements 522 receives a number of inputs, including input clock 502, push indicator 504 (which is used to indicate a write operation in various embodiments), and write pointer (wr_ptr) 560, which indicates which entry in buffer 500 is the next to be accessed (e.g., the next to be written to). Low-frequency clock circuit 520 also receives input data 510A, which is composed of m bits, as well as the current contents of the individual entries of low-frequency storage 540. Additionally, in some embodiments, each element in low-frequency clock circuit 520 is configured to receive a respective entry value 506A-C (not pictured) that indicates which number low-frequency buffer entry 542 the clock circuit element 522 is associated with. The use of entry value 506 will be illustrated further with reference to FIG. 6. As shown, each low-frequency clock circuit element 522 is configured to generate a respective clock signal 524 to its corresponding low-frequency buffer entry 542. Clock signal 524 may alternately be characterized as an output clock signal of one of elements 522 or an input clock signal to one of low-frequency buffer portions 542.

High-frequency clock circuit 540, on the other hand, includes, in the configuration illustrated in FIG. 5, individual high-frequency clock circuit elements 532A-C. Each of clock circuit elements 532 receives a number of inputs, including input clock signal 502 and push indicator 504. As with low-frequency clock circuit 520, entries in high-frequency clock circuit 530 also receive a respective entry value 506A-C (not pictured) that indicates which number high-frequency buffer entry 552 the clock circuit element 532 is associated with. As illustrated, each of the individual high-frequency clock circuits 532 provides a clock signal 534 to its corresponding high-frequency buffer 552. Clock signal 534 signal may alternately be characterized as an output clock signal of one of elements 552 or an input clock signal to one of high-frequency buffer portions 532. Further exemplary details of clock circuits 520 and 530 will now be described with respect to FIG. 6.

Figure 6:
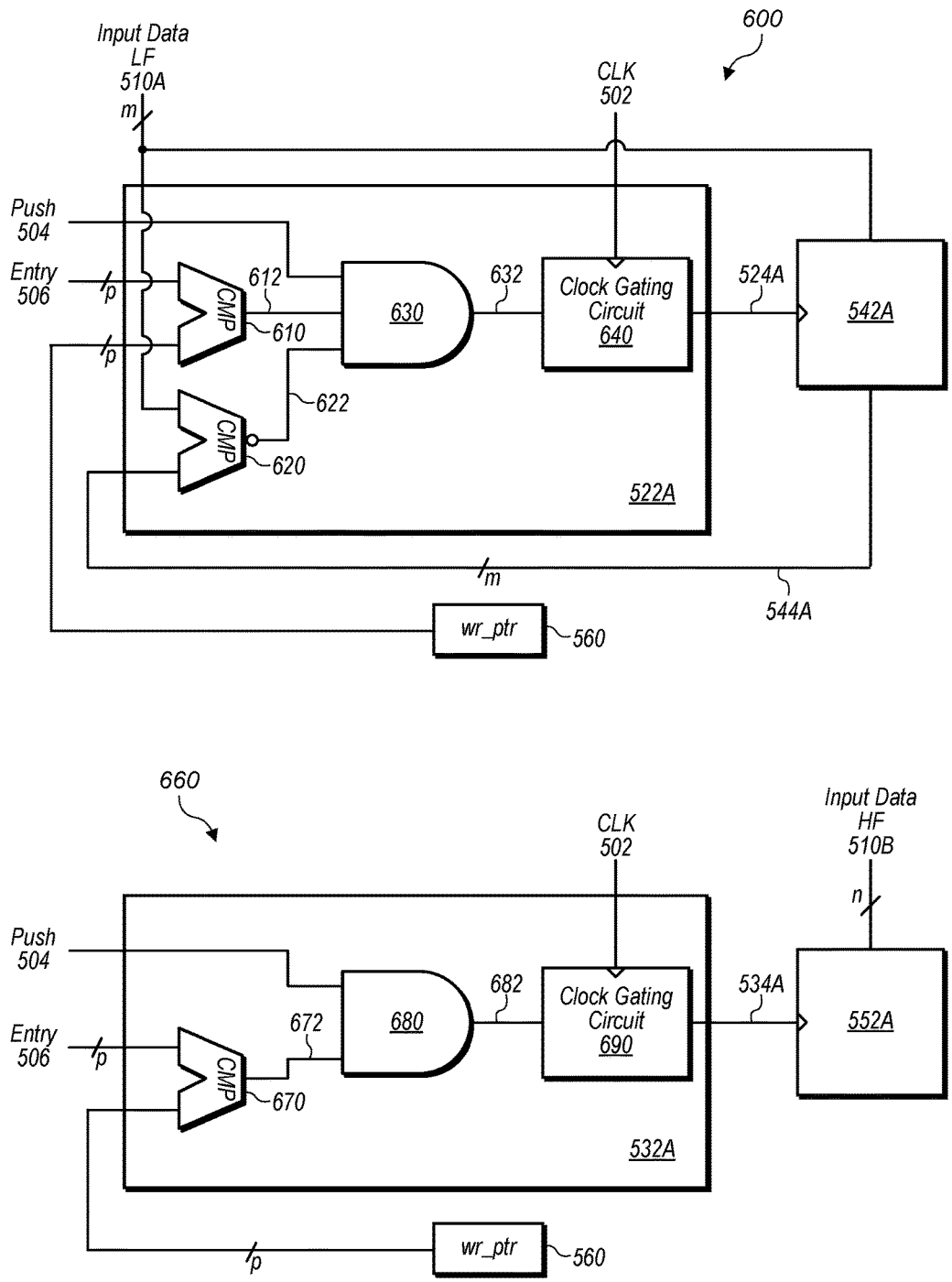
FIG. 6 depicts block diagrams of exemplary clock circuits coupled to high-frequency and low-frequency portions of a FIFO buffer entry, according to some embodiments.

Referring now to FIG. 6, block diagrams are shown of exemplary clock circuits that are coupled to high- and low-frequency portions of a FIFO entry, according to some embodiments. Some elements in FIG. 6 appear in FIG. 5, and are numbered similarly. As indicated in FIG. 5, clock circuits 520 and 530 may have various clock circuit elements, each coupled to a particular portion of an entry in buffer 500. Block diagram 600 depicts clock circuit element 522A within clock circuit 520 providing a clock signal 524A to low-frequency portion 542A of an entry within buffer 500, while block diagram 660 depicts clock circuit element 532A within clock circuit 530 providing a clock signal 534A to high-frequency portion 552A of the same buffer entry.

Block diagram 660 is comparatively simpler than block diagram 600, and is thus described first. As noted, clock circuit element 532A provides clock signal 534A to HF buffer portion 552. More specifically, clock signal 534A is provided as the output of clock gating circuit 690, which may correspond to clock circuit 300 depicted in FIG. 3, in some embodiments. In the configuration depicted in FIG. 6, clock gating circuit is configured to activate clock signal 534A based on input CLK 502 and enable signal 682. As shown, enable signal 682 is driven by two-input AND gate 680. Gate 680 is activated, in these embodiments, when push signal 504 is active and when the write pointer for the FIFO (wr_ptr 560) is pointing to buffer portion 552A. The latter condition is met, in the depicted configuration, when binary comparator 670 indicates, via output signal 672, that the numerical index for buffer entry 552A (entry value 506) is equal to an index stored in write pointer 560. As one brief example, if buffer 500 contains 8 entries (0-7), entry value 506 and write pointer 560 may each be represented by 3 bits (p=3). If buffer portion 552 is entry 6, for example, entry value 506 for clock circuit element 532A could be represented by 110b. In this example, comparator 670 would convey an active output signal 672 when write pointer 560 also stores the value 110b. Enable signal 682 is thus driven when there is a write (indicated by push signal 504), and that write is to the particular buffer entry corresponding to clock circuit element 532A. In the depicted configuration, when clock signal 534A is active, the n bits of high-frequency input data 510B are written to high-frequency buffer portion 552A.

In the present disclosure, when a signal such as EN signal 682 is described as being "active," this does not necessarily mean that this signal is a logic high. In various embodiments, the signals described herein may either be active high or active low, for example. Note further that the particular configuration of combinatorial logic shown in block diagram 660 is exemplary and may be configured differently in other embodiments to achieve a similar result.

Block diagram 600, which depicts clock circuit element 522A of clock circuit 520 providing a clock signal 524A to low-frequency buffer portion 542, is similar to block diagram 660 just discussed. As in block diagram 600, clock circuit element 522A includes a clock gating circuit (element 640) that receives input CLK 502 and an enable signal 632. Instead of a two-input AND gate as in block diagram 660, enable signal 632 is driven by a three-input AND gate 630. The top two inputs to gate 630, push signal 504 and output 612 of comparator 610 are active under the same conditions described for comparator 670 in block diagram 660. Gate 630 includes a third input 622, which is active when comparator 620 indicates the current m bits of low-frequency buffer portion 542A (indicated by reference numeral 544A) are not equal to the incoming m bits for that buffer portion, input data 510A. (Note that the output of comparator 620 is inverted.) Enable signal 632 is thus active when there is a write to the particular buffer entry 542A that corresponds to clock circuit element 522A, and input data 510A differs from current buffer contents 544A in at least one bit. It can thus be seen that clock circuit elements of low-frequency clock circuit 520 may be clock gated more frequently than clock circuit elements of high-frequency clock circuit 530, potentially providing power savings to the low-frequency portions of the FIFO buffer entry.

In the configuration depicted in block diagram 600, all storage circuits within low-frequency buffer portion 542A are clocked (i.e., receive an active clock signal) when the bit value for some part of the low-frequency portion changes. In an alternate set of embodiments, each storage circuit within buffer portion 542A may be individually clock gated—that is, only those storage circuits whose value is changing will be clocked. In such an implementation, there could be up to m clock circuit elements 522 for buffer entry portion 542. Comparator 620 could be replaced, in these embodiments, by a two-input AND gate that compares a single bit of low-frequency input data 510A to the current bit value of buffer entry portion 542A.

In various embodiments, an apparatus includes a first clock circuit configured to provide a first clock signal to a first group of storage circuits within a first portion (e.g., the high-frequency portion) of a particular entry of a buffer in response to an indication that the particular entry is being written to. The apparatus further includes a second clock circuit configured to provide a second clock signal to a particular storage circuit of a second group of storage circuits within a second portion (e.g., the low-frequency portion) of the particular entry in response to an indication that the particular entry is being written to with a value that changes the current content of the particular storage circuit. The second clock circuit is further configured to provide additional clock signals to remaining storage circuits of the second group within the second portion of the particular entry in response to an indication the particular entry is being written to with a value that changes the current contents of the remaining storage circuits.

The single-bit comparison implementation described above and the m-bit comparison implementation depicted in block diagram 600 represent ends of a spectrum. One of ordinary skill in the art can also envision implementations in which low-frequency buffer portion 542A is divided into two or more constituent parts, each of which is either clocked or clocked gated as a monolithic unit. (For example, if low-frequency buffer portion 542A is 8 bits, this portion might be divided into 2 parts of 4 bits each. Thus, if any storage circuit within the first part changes, all of the storage circuits within that part will be clocked. For the same write operation, however, none of the storage circuits within the second part are necessarily clocked, however.)

Figure 7:
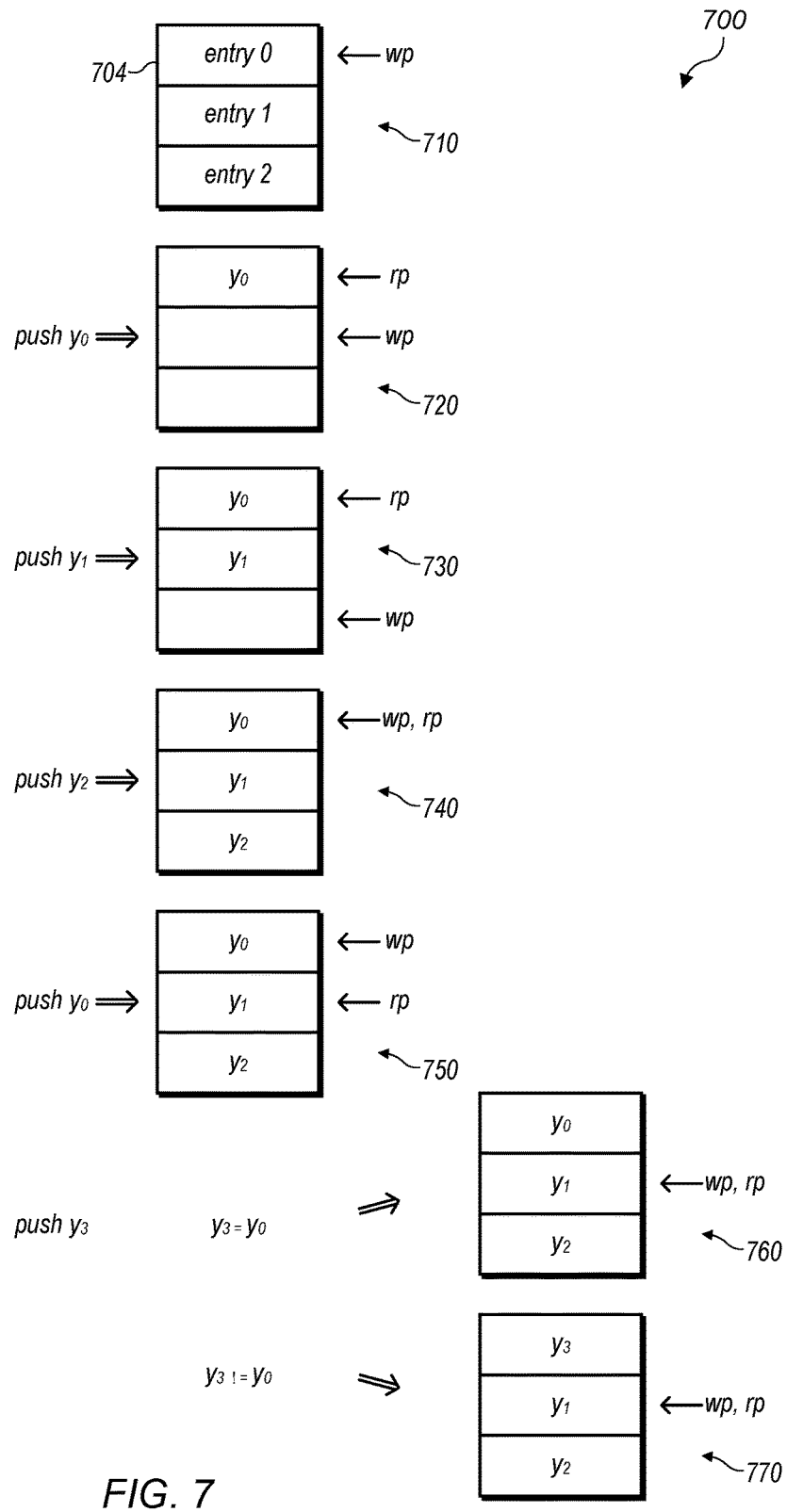
FIG. 7 illustrates exemplary operations performed on a low-frequency portion of a FIFO buffer entry, according to some embodiments.

Referring now to FIG. 7, a diagram 700 is provided that illustrates exemplary operation of a low-frequency (LF) portion 704 of a FIFO buffer. LF portion 740 may be part of buffer 500 previously described with respect to FIGS. 5 and 6, as well as any low-frequency buffer portion in accordance with the present disclosure. For illustrative purposes, the FIFO buffer is indicated as having 3 entries, but of course different numbers of entries may be utilized in various embodiments.

Reference numeral 710 illustrates a starting condition in which LF portion 740 is empty. In this situation, the write pointer (wp) the points to the first entry. Thus, a next write to the buffer will be written to entry 0. Although not pictured, this next write will also cause a corresponding entry in a high-frequency portion of the buffer to be written as well.

Reference numerals 720, 730, and 740 illustrate successive write (push) operations to LF portion 740. As shown, these write operations write values $y_0$, $y_1$, and $y_2$, to entries 0-2, respectively. Because this is a first-in, first-out buffer, upon the write of $y_0$, read pointer (rp) thus points to entry 0. The successive writes of $y_1$ and $y_2$ do not change the read pointer, since under the FIFO paradigm, $y_0$ is read (popped) before $y_1$ or $y_2$. Each write operation, however, advances the write pointer to the next available entry, leading to the scenario indicated by reference numeral 740 in which all entries are occupied. Here, the write pointer and read pointer both point to entry 0.

Reference numeral 750 illustrates a read operation (pop) from LF buffer portion 740. (Again, a corresponding pop operation also occurs in the HF buffer portion, which is not pictured.) Such a read may be needed in certain embodiments in which a value must be read from a full FIFO buffer before any new value may be written. As shown, this read operation has the effect of advancing the read pointer to entry 1. The write pointer remains pointing to entry 0.

Reference numerals 760 and 770 illustrate alternative scenarios upon a subsequent write operation of data value $y_3$ to LF buffer portion 740. Which of these scenarios ensues depends upon whether $y_3$ is equal to the current contents of the entry pointed to by the write pointer, namely $y_0$. Reference numeral 760 illustrates the situation in which $y_3$ is equal to $y_0$. In this situation, the write pointer is updated to point to entry 1, but no change is made to the contents of entry 0, which retains the value $y_0$. This result may be accomplished, in various embodiments, by clock gating the clock signals to entry 0 of LF buffer portion 740. On the other hand, when $y_3$ is not equal to $y_0$, the clock signals to entry 0 of LF buffer portion 740 are not clock gated, causing entry 0 to receive value $y_3$.

As previously indicated, the clock gating of a low-frequency portion of a storage element such as an entry within buffer portion 740 may be done at various levels of granularity. Diagram 700 illustrates an example in which storage circuits within buffer portion 740 are either clocked or clock gated as a monolithic entity, but it would be apparent to one of ordinary skill in the art in view of the present disclosure that different levels of clock control may be utilized. In various embodiments, each individual storage circuit within an entry in LF buffer portion 740 may be separately controlled (i.e., clocked or clock gated). In other embodiments, the storage circuits within LF buffer portion 740 may be divided into groups, each of which is either clocked or clock gated as a unit.

FIGS. 4 and 5 depicted exemplary storage elements that are clocked according to multiple clocking schemes. As has been described, a first portion of a storage element may be clocked according to a first clocking scheme, while a second, different portion of the storage element may be clocked according to a second, different clocking scheme. (Additional clocking schemes can also be utilized for other portions of the storage element as needed.) The first portion of the storage element may constitute a high-frequency portion, while the second portion may constitute a low-frequency portion. In certain embodiments, this high-frequency portion may be clocked upon each access to the storage element, while the low-frequency portion is clocked only upon an access to the storage element that changes some part of the low-frequency portion.

In certain implementations of these principles, the different portions of the storage element (i.e., which storage circuits within the storage element correspond to the first and second portions, respectively) are fixed at some point during the design process of the storage element. In other words, during design time the portions of the storage element are assigned and are not changeable during operation of the computing system that includes the storage element. Such a design may be referred to as a "static" implementation of multiple clocking schemes for a storage element.

For example, the system architecture of the computing system that includes an exemplary storage element may, in some circumstances, dictate certain properties for a value to be stored in a particular storage element being designed according to principles set forth in the present disclosure. For example, consider a scenario in which a storage element is designed to store an address of a graphical pixel currently being operated on. If the computing system that includes this storage element is designed to operate on a window or region of pixels at a given time, this may mean that the upper-order bits of the storage element (i.e., those bits that specify a given pixel window) may be characterized as a low-frequency portion of the storage element, while lower-order bits of the storage element (i.e., those bits that specify a particular pixel within a pixel window) may be characterized as a high-frequency portion of the storage element. In this manner, the low-frequency and high-frequency portions of the storage element may advantageously be clocked according to different clocking schemes, such as those previously discussed. In such a scenario, certain implementations of the exemplary storage element would statically assign the low-frequency and high-frequency portions and the composition of these portions would not change dynamically (i.e., during operation of the computing system that includes the exemplary storage element). In many instances, a static assignment of portions of a particular storage element is desirable, particularly where there is no situation in which the composition of the constituent portions of the storage element might change (e.g., where the storage element is used for only one purpose, and its bit values have consistent frequency properties).

In other instances, however, the frequency properties of a particular storage element may change at different times during operation. In these scenarios, a design may be desirable that allows not only the use of different clocking schemes for different portions of a given storage element, but also one that allows the composition of these portions to be changed during operation. Such a design may be characterized as a "dynamic" implementation of the multiple clocking scheme idea. Potential configurations of a dynamic implementation of multiple clocking schemes are discussed next with references to FIGS. 8-10.

Figure 8:
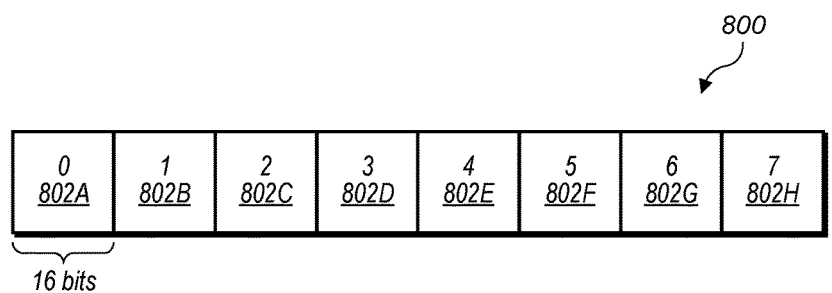
FIG. 8 illustrates exemplary assignments of high-frequency and low-frequency portions of an exemplary storage element under different operating modes, according to some embodiments.

Referring now to FIG. 8, exemplary assignments of high-frequency and low-frequency portions of an exemplary storage element are illustrated for different operating modes, according to some embodiments. Consider storage element 800. This storage element is illustrated as having 8 portions (labeled 0-7 and indicated by reference numerals 802A-H). In the depicted embodiment, each portion has 16 bits, such that storage element has 128 bits in total (and thus up to 128 storage circuits). Suppose that storage element 800 is designed such that it stores values with bit locations having different frequency properties at different points in time. For example, storage element 800 might be a storage element associated with a bus interface unit (e.g., a storage element that stores a value to be written to an associated bus). Thus, at different points in time, the bus may be operating in different modes, with the potential result that the values being stored in the storage element may have different high-frequency and low-frequency compositions at different points in time.

For example, consider modes 0 and 1 indicated by reference numerals 810A-B in FIG. 8. In mode 0, the high-frequency portions of storage element are portions 0, 1, 2, and 7, while the low-frequency portions are 3, 4, 5, and 6. (Of course, in other example, these portions could be assigned differently. Further, storage element 800 might have more than two clocking schemes in various embodiments.) Conversely, in mode 1, the high-frequency portions are 4, 5, 6, and 7, while the low-frequency portions are 0, 1, 2, and 3. Given these exemplary operating modes, a table 820 is shown that indicates which clocking schemes are to be utilized for each mode. Although any suitable clocking scheme may be used, in FIG. 8, two particular clocking schemes are used. High-frequency portions are clocked upon an access to the storage element, which is referred to herein as enable-based clocking (indicated by "en"). On the other hand, low-frequency portions are clocked only upon an access to the storage element that changes at least some part of that portion of the storage element. This is referred to in FIG. 8 as XOR clock gating (indicated by "en_XOR"), but other suitable forms of clock gating might be used. Thus, while the high-frequency portions are provided an active clock signal whenever there is an access to the storage element (enable-based clocking), the low-frequency portions are provided an active clock signal whenever there is an access to the storage element and when there is a change to those portions of the storage element.

It can be seen from the portion of FIG. 8 indicated by reference numeral 820 that portions within storage element 800 fall into one of three categories with respect to operating modes 0 and 1: 1) those portions that use enable-based clocking in both modes (portion 7); 2) those portions that use XOR clock gating in both modes (portion 3); and 3) those portions that use both enable-based clocking in one mode and XOR clock gating in the other mode (portions 0-2 and 4-6). By generating enable signals for portions of storage element 800 according to the different operating modes, a dynamic implementation of the multiple clocking scheme idea may be achieved. Thus, for those implementations in which first and second groups of storage circuits within respectively constitute a high-frequency portion and a low-frequency portion of a storage element, the apparatus that includes the storage element may be designed such that it is configured to change, during operation, composition of the high-frequency and low-frequency portions of the storage element.

Figure 9:
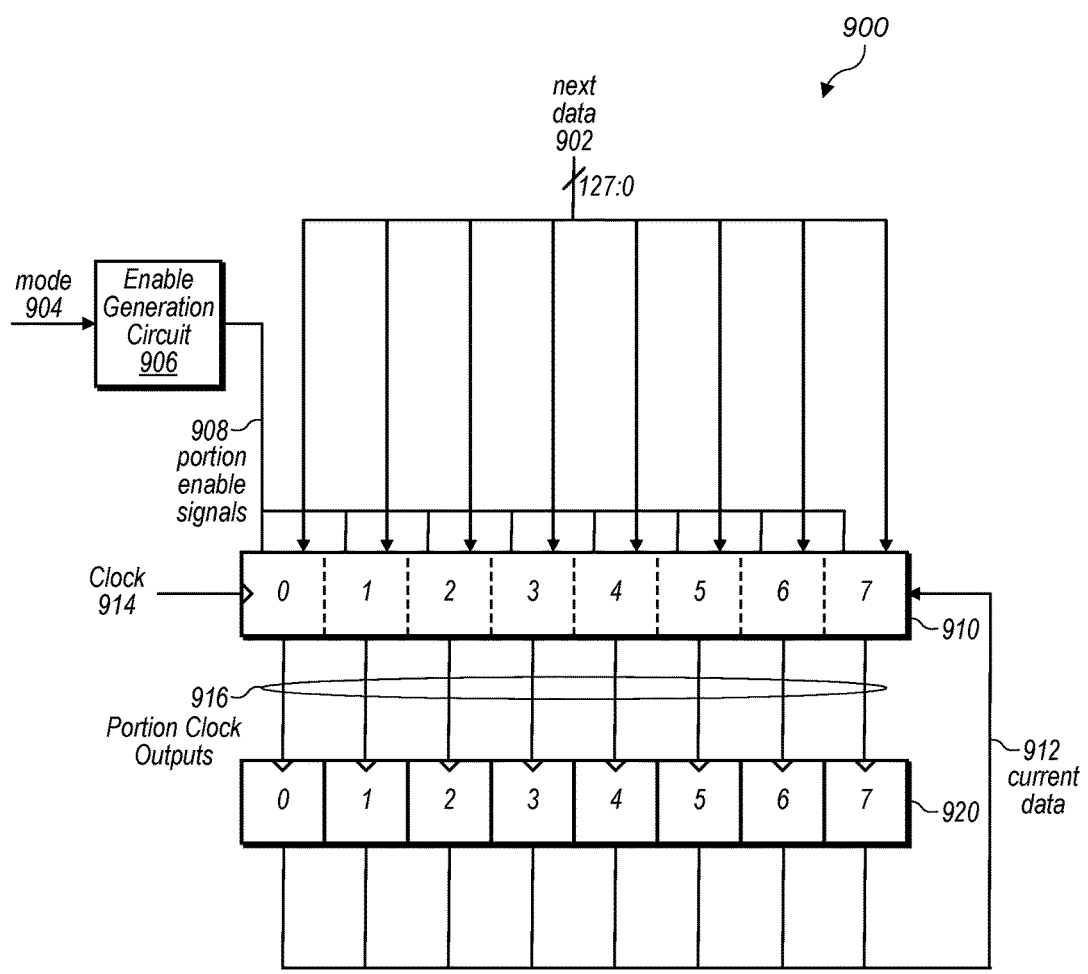
FIG. 9 illustrates a block diagram of an exemplary storage element, clock circuitry and enable generation circuit, according to some embodiments.

Referring now to FIG. 9, a block diagram is shown of a portion of an exemplary computing system 900 that includes a storage element, clock circuitry and enable generation circuit that implement dynamic assignment of multiple clocking schemes for storage circuits within the storage element. For example, the storage element may, in various embodiments, be a bus interface storage element that is configured to store a value to be conveyed on a bus. In such an implementation, the enable generation circuit is configured to generate enable signals according to a current one of a plurality of operating modes for the bus. FIG. 9, of course, is not limited to implementation in association with a bus interface circuit.

As illustrated, computing system 900 is an apparatus that includes a storage element 920 having portions 0-7. Each of these portions is comprised of a plurality of storage circuits configured to store respective bit values. Computing system 900 further includes a plurality of clock circuits 910, each corresponding to one of the portions of the storage element. For example, clock circuit 1 within the block labeled with reference numeral 910 corresponds to portion 1 of storage element 920. As illustrated, each of the plurality of clock circuits 910 is configured to provide a respective clock signal (one of the signals indicated by reference numeral 916) to storage circuits in its corresponding portion of the storage element. The output of each clock circuit 910 is referred to in FIG. 9 as a "portion clock output."

Computing system 900 still further includes enable generation circuit 906 that is configured to provide, based on a first operating mode for the storage element (which may be indicated by mode signal 904 in some embodiments), enable signals 908 to each of the plurality of clock circuits 910. In this configuration, the enable signals 908 for the first operating mode specify that storage circuits within a subset of the different portions of storage element 920 are clocked on a write operation to storage element 920 (e.g., next data 902); further, enable signals 908 specify that storage circuits within remaining ones of the different portions of storage element 920 are selectively clock gated on a write operation.

For example, during a write operation to the storage element in the first operating mode, a set of enable signals may be provided that cause storage circuits within the remaining ones of the different portions to be clock gated in response to the bit values for those storage circuits being unchanged by the write operation. (Conversely, those storage circuits that are being changed by the write operation are provided an active clock signal.) In various embodiments, portion enable signals 908 may accomplish this selective clock gating by indicating to various ones of clock circuits 910 that XOR clock gating is to be implemented for the corresponding portions of storage element 920. Thus, ones of clock circuits 910 may, in some embodiments, compare portions of the current contents of storage element 920 (indicated by current data 912 in FIG. 9) to corresponding portions of the incoming data (next data 902). As used herein, references to "selective clock gating" of a group of storage circuits means that storage circuits in the group are clock gated if some clock gating criteria is satisfied, with the result that different storage circuits within the group may be clock gated on a write operation, while other storage circuits are provided an active clock signal for the same write operation.

The configuration depicted in FIG. 9 allows enable generation circuit 906 to dynamically change the clocking scheme used by various ones of clock circuits 910 during operation. For example, during a first operating mode, a first group of storage circuits and a second, remaining group of storage circuits may respectively constitute a high-frequency portion and a low-frequency portion of the storage element. During a second, different operating mode for the storage element, enable generation circuit 906 may be configured to provide a set of enable signals that causes the high-frequency and low-frequency portions of the storage elements to be constituted differently. For example, enable generation circuit 906 may be configured to generate enable signals for a particular one of the different portions such that the particular portion is clocked according to a first clocking scheme in a first operating mode and is clocked according to a second, different clocking scheme in a second operating mode. An example of such a reconfiguration has previously been illustrated with respect to FIG. 8, in which portion 2 is clocked according to enable-based clocking during mode 0, and clocked according to XOR clock gating during mode 1. In various embodiments, enable generation circuit 906 may constitute combinatorial logic, such as that needed to implement the table depicted in FIG. 8.

Figure 10:
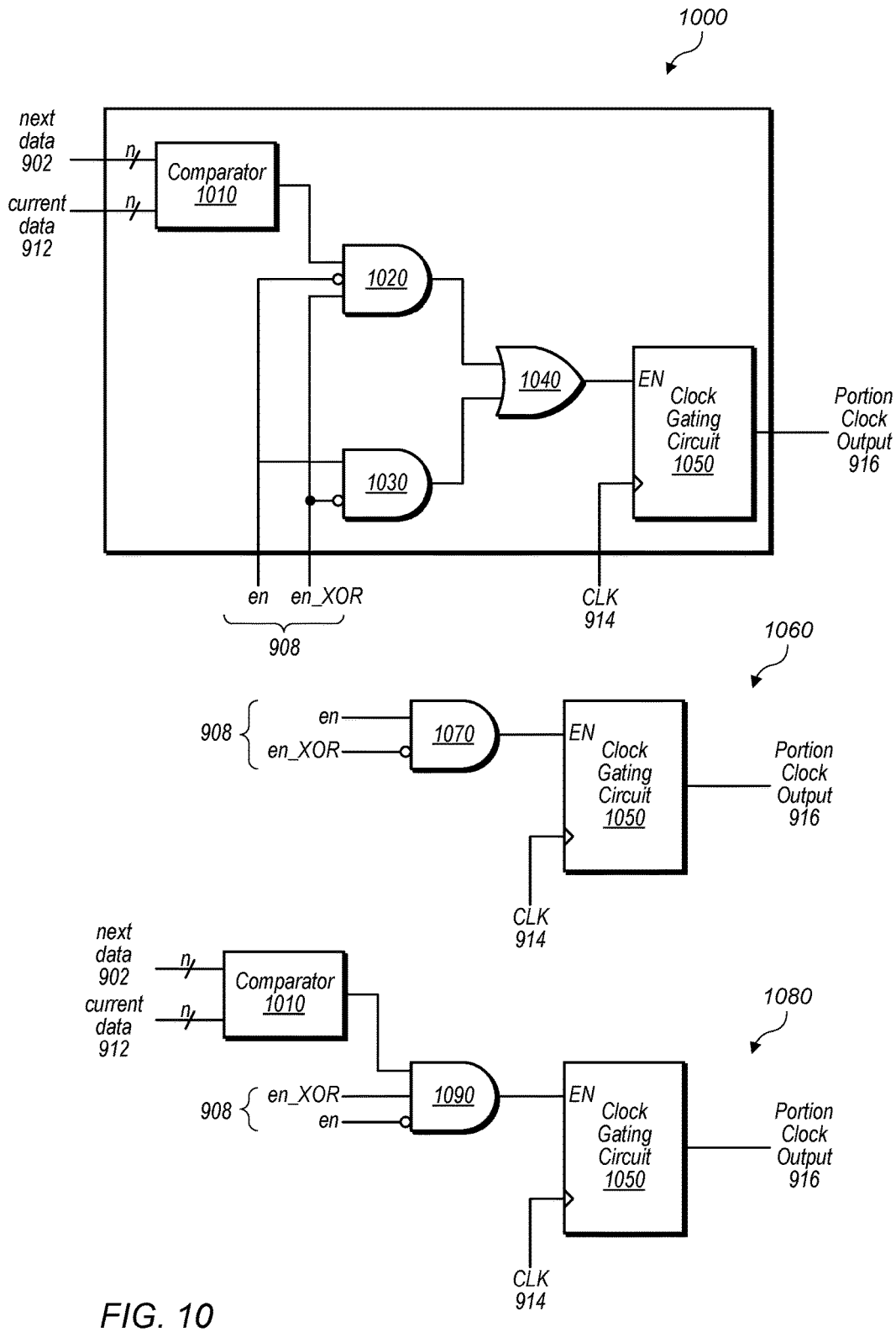
FIG. 10 illustrates a block diagram of an exemplary clock circuits configured to couple to a portion of a storage element, according to some embodiments.

Referring now to FIG. 10, a block diagram of exemplary clock circuits 1000, 1060, and 1080 that may be used, in some embodiments, to dynamically implement multiple clocking schemes for a storage element. Recall the exemplary clocking table depicted in FIG. 8, in which certain portions use enable-based clocking regardless of operating mode (portion 7), certain portions always use XOR clock gating (portion 3), and certain portions use both enable-based clocking and XOR clock gating depending on the operating mode (portions 0-2 and 4-6). Clock circuits for these portions may be respectively implemented, in various embodiments, using clock circuits 1060, 1080, and 1000.

Figure 3:
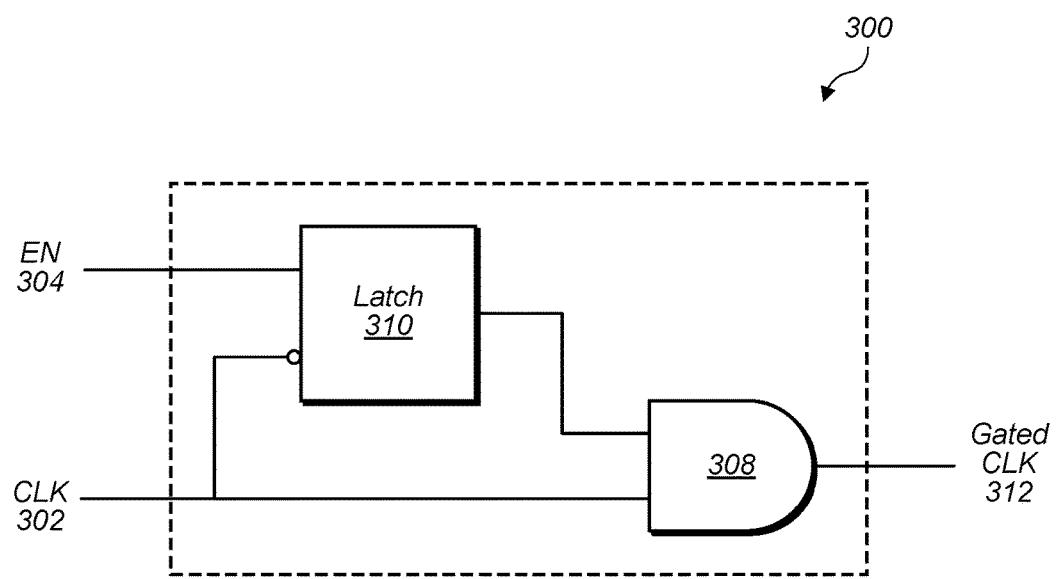
FIG. 3 is a block diagram of an exemplary clock circuit, according to some embodiments.

Clock circuit 1060 includes a clock gating circuit 1050, which may correspond to clock gating circuit 300 depicted in FIG. 3 in some embodiments and provide a buffered version of CLK signal 914 as portion clock output 916. As shown, an active EN input to clock gating circuit 1050 is provided by AND gate 1070 when enable-based clocking signal (en) is active and when XOR clock gating (en_XOR) is inactive. Accordingly, clock circuits 910 corresponding to portions of storage element 920 that always use enable-based clocking may be clocked via portion clock output 916 using clock circuit 1060. Clock circuit 1060, in some embodiments, is driven by en and en_XOR signals 908 generated by enable generation circuit 906.

Clock circuit 1080, in contrast, may be used for portions of storage element 920 that always use XOR clock gating. As in clock circuit 1060, the EN signal for clock gating circuit 1050 of clock circuit 1080 is driven by an AND gate, which is indicated by reference numeral 1090. AND gate 1090 is active when en_XOR signal is active, en is inactive, and when the output of comparator 1010 indicates that next data 902 differs from current data 912 in some respect. (In the depicted configuration, comparator 1010 outputs a logical '1' value in response to a mismatch in input values, and a logical '0' value in response to a match of input values. Thus, the output of AND gate 1090 is a logical '1' when comparator 1010 indicates a mismatch between next data 902 and current data 912 and when en_XOR is active. In other configurations of course, the comparator could be configured differently, which could, in some embodiments, mean that the output of the comparator might be inverted before being provided to AND gate 1090.) In some embodiments, various comparisons may be performed for different parts of a portion 920, such that the constituent storage circuits are selectively clock gated.

Clock circuit 1000 is, in some embodiments, a combination of clock circuits 1060 and 1080. In clock circuit 1000, the EN signal to clock gating circuit 1050 is driven by the output of OR gate 1040, which receives inputs from AND gates 1020 and 1030. Note that the inputs to AND gate 1020 correspond to those described for AND gate 1090 in clock circuit 1080, while the inputs to AND gate 1030 correspond to those described for AND gate 1070 in clock circuit 1060. Accordingly, the output of OR gate 1040 is active in two cases: 1) if en signal is active (and en_XOR is inactive), or 2) if en_XOR is active, en is inactive, and some portion of next data 902 differs from current data 912. In this manner, portion clock output 916 will be active (producing a buffered version of CLK signal 914) according to whether enable-based clocking or XOR clock gating is being used.

Various modifications to the circuitry depicted in FIG. 10 are contemplated. For example, in circuit 1000, if XOR clock gating is not enabled (i.e., the en signal is active, but en_XOR is not), power can be saved by causing next data 902 and current data to always generate a match. This may be done in some instances by gating next data 902 and current data 912, thus providing logical '0' levels to comparator 1010 such that no circuit elements within comparator 1010 will change state. If comparator 1010 is configured, as in FIG. 10, to output a logical '0' value on a match on input values, this will cause the output of AND gate 1020 to also be a logical '0'. Gating next data 902 and current data 912 when XOR clock gating is not enabled saves comparator 1010 from having to perform a comparison when the result does not affect the output of XOR gate 1040, which provides the EN signal to clock gating circuit 1050.

Figure 11:
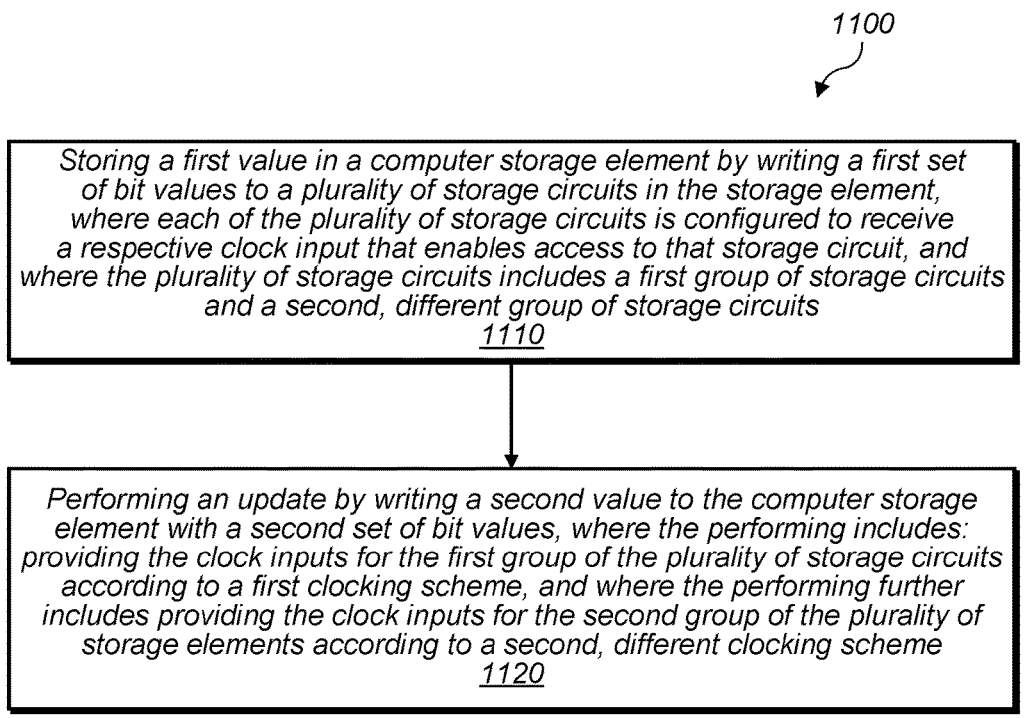
FIG. 11 is a flow diagram illustrating an exemplary method for clocking a storage element.

Various embodiments of hardware configured to implement multiple clocking schemes for a storage element have been described with reference to the preceding figures. Referring now to FIG. 11, a flow diagram is depicted of an exemplary method 1100 for clocking such a storage element. As can been seen method 1100 comprises steps 1110 and 1120. Step 1110 includes storing a first value in a computer storage element (e.g., storage element 420) by writing a first set of bit values to a plurality of storage circuits in the storage element (e.g., 422A-D), where each of the plurality of storage circuits is configured to receive a respective clock input that enables access to that storage circuit (e.g., 414A-C). Further, the plurality of storage circuits includes a first group of storage circuits and a second, different group of storage circuits. For example, relative to FIG. 4, the first group includes storage circuits 422A and 422B, while the second group includes storage circuits 422C and 422D. Flow then proceeds to step 1120, which includes performing an update to the computer storage element with a second set of bit values. The performing includes, within method 1100, providing the clock inputs for the first group of the plurality of storage circuits according to a first clocking scheme, and providing the clock inputs for the second group of the plurality of storage elements according to a second, different clocking scheme.

In one example implementation of method 1100, providing the clock inputs for the first group of storage circuits according to a first clocking scheme includes providing an active clock signal to each of the clock inputs of the first group of storage circuits such that respective ones of the second set of bit values are written to the first group of storage circuits. Conversely, providing the clock inputs for the second group of the plurality of storage elements according to the second clocking scheme includes clock gating at least one of the second group of storage circuits such that content of the at least one storage circuit is not changed by the update. In some embodiments, this clock gating may be based on a determination that a bit value being written by the update to the at least one storage circuit is the same as a current value of the at least one storage circuit. Providing the clock inputs for the second group of the plurality of storage elements according to the second clocking scheme may further include providing an active clock signal to one or more of the second group of storage circuits whose contents are being changed by the update.

As previously discussed, in various embodiments, a computing system that clocks first and second groups of storage elements according to different clocking schemes may also change the composition of the first and second groups according to different operating modes. Note that this disclosure is not limited to the use of just two clocking schemes for a given storage element; the idea may be extended to three (or more) clocking schemes. For example, a first group of storage circuits within a storage element may always be clocked upon an access to the storage element, while each bit within a second group of storage circuits may always be selectively clock gated on a bit-by-bit basis (e.g., XOR clock gated). Additionally, a third group of storage circuits may be clocked according to some other scheme—for example, a scheme in which all storage circuits in the group are clocked if there is any change within the group.

Accordingly, the storing of the first value may be performed in a first operating mode, and the method may further include storing a second value in the storage element during a second operating mode in which the first and second groups of storage circuits are constituted differently than in the first operating mode, such that one or more storage circuits that were in the first group of storage circuits during the first operating mode are in the second group of storage circuits during the second operating mode. For example, consider first and second groups of storage circuits that respectively constitute high-frequency and low-frequency portions of the storage element. In such a scenario, a storage circuit that is designated as being in the high-frequency portion of the storage element during the first operating mode may be designated as being in the low-frequency portion of the storage element during the second operating mode.

Figure 12A:
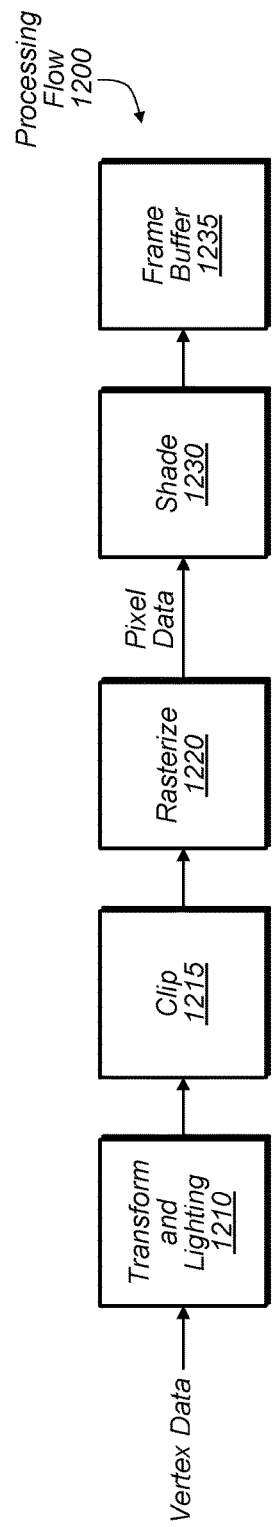
FIG. 12A is a block diagram illustrating an exemplary graphics processing flow.
Figure 12B:
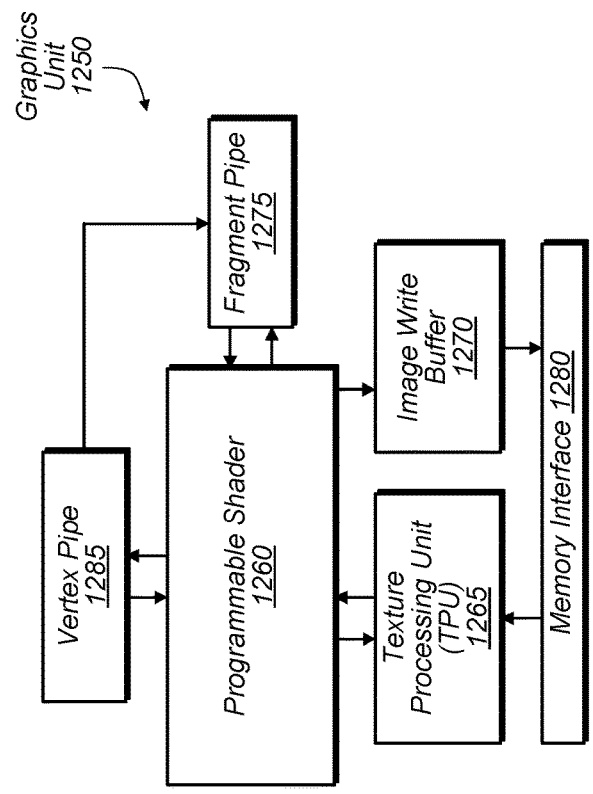
FIG. 12B is a block diagram illustrating an exemplary graphics processing unit.

As has been emphasized, the use of techniques disclosed herein is not limited to any particular use case. Indeed, there are many different potential applications of the disclosed techniques. In one particular example, the value being stored in the storage element is a pixel coordinate value, and the storage element is within a graphics processing circuit that is configured to use pixel coordinate values stored in the storage element to operate on different regions of pixels (such as for an associated display device). In such a setting, clock gating may be performed on those ones of the plurality of storage circuits in the storage element that do not change frequently while working with a given region of pixels. Consider a storage element that has 32 bits, and a pixel region of size $2^{18}$. Accordingly, when working within this region (such as in a particular pipeline stage of a graphics processing unit), the storage element may advantageously be clocked using two different clocking schemes. For example, the upper 14 bits may be XOR clock gated, while the lower 18 bits are clocked upon an access to the storage element. FIGS. 12A and 12B provide further context for a potential implementation within a graphics processing unit.

Referring now to FIG. 12A, a flow diagram illustrating an exemplary processing flow 1200 for processing graphics data is shown. In one embodiment, transform and lighting step 1210 may involve processing lighting information for vertices received from an application based on defined light source locations, reflectance, etc., assembling the vertices into polygons (e.g., triangles), and/or transforming the polygons to the correct size and orientation based on position in a three-dimensional space. Clip step 1215 may involve discarding polygons or vertices that fall outside of a viewable area. Rasterize step 1220 may involve defining fragments or pixels within each polygon and assigning initial color values for each fragment, e.g., based on texture coordinates of the vertices of the polygon. Shade step 1230 may involve altering pixel components based on lighting, shadows, bump mapping, translucency, etc. Shaded pixels may be assembled in a frame buffer 1235. Modern GPUs typically include programmable shaders that allow customization of shading and other processing steps by application developers. Thus, in various embodiments, the exemplary steps of FIG. 12A may be performed in various orders, performed in parallel, or omitted. Additional processing steps may also be implemented.

Referring now to FIG. 12B, a simplified block diagram illustrating one embodiment of a graphics unit 1250 is shown. In the illustrated embodiment, graphics unit 1250 includes programmable shader 1260, vertex pipe 1285, fragment pipe 1275, texture processing unit (TPU) 1265, image write buffer 1270, memory interface 1280, and texture state cache 1290. In some embodiments, graphics unit 1250 is configured to process both vertex and fragment data using programmable shader 1260, which may be configured to process graphics data in parallel using multiple execution pipelines or instances.

Vertex pipe 1285, in the illustrated embodiment, may include various fixed-function hardware components configured to process vertex data. Vertex pipe 1285 may be configured to communicate with programmable shader 1260 in order to coordinate vertex processing. In the illustrated embodiment, vertex pipe 1285 is configured to send processed data to fragment pipe 1275 and/or programmable shader 1260 for further processing.

Fragment pipe 1275, in the illustrated embodiment, may include various fixed-function hardware configured to process pixel data. Fragment pipe 1275 may be configured to communicate with programmable shader 1260 in order to coordinate fragment processing. Fragment pipe 1275 may be configured to perform rasterization on polygons from vertex pipe 1285 and/or programmable shader 1260 to generate fragment data. Vertex pipe 1285 and/or fragment pipe 1275 may be coupled to memory interface 180 (coupling not shown) in order to access graphics data.

Programmable shader 1260, in the illustrated embodiment, is configured to receive vertex data from vertex pipe 1285 and fragment data from fragment pipe 1275 and/or TPU 1265. Programmable shader 1260 may be configured to perform vertex processing tasks on vertex data which may include various transformations and/or adjustments of vertex data. Programmable shader 1260, in the illustrated embodiment, is also configured to perform fragment processing tasks on pixel data such as texturing and shading, for example. Programmable shader 1260 may include multiple execution instances for processing data in parallel.

TPU 1265, in the illustrated embodiment, is configured to schedule fragment processing tasks from programmable shader 1260. In some embodiments, TPU 1265 is configured to pre-fetch texture data and assign initial colors to fragments for further processing by programmable shader 1260 (e.g., via memory interface 1280). TPU 1265 may be configured to provide fragment components in normalized integer formats or floating-point formats, for example. In some embodiments, TPU 1265 is configured to provide fragments in groups of four (a "fragment quad") in a 2×2 format to be processed by a group of four execution pipelines in programmable shader 1260. In some embodiments, storage elements within TPU 1265 may advantageously use multiple clocking schemes. Various registers within TPU 1265 may store pixel coordinate values, for example, and thus may benefit from the teachings of the present disclosure if bit locations within the registers exhibit different frequency properties.

Image write buffer 1270, in the illustrated embodiment, is configured to store processed tiles of an image and may perform final operations to a rendered image before it is transferred to a frame buffer (e.g., in a system memory via memory interface 1280). Memory interface 1280 may facilitate communications with one or more of various memory hierarchies in various embodiments.

In various embodiments, a programmable shader such as programmable shader 1260 may be coupled in any of various appropriate configurations to other programmable and/or fixed-function elements in a graphics unit. The exemplary embodiment of FIG. 12B shows one possible configuration of a graphics unit 1250 for illustrative purposes.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a register including a plurality of storage circuits and configured to store a value as a plurality of bit values, wherein each of the plurality of storage circuits is configured to receive, in response to a write operation addressed to the register, a respective clock input that enables a bit value to be written to that storage circuit;
   a first clock circuit configured to receive an input clock signal and generate a first output clock signal according to a first set of criteria, wherein the first clock circuit is configured to provide the first output clock signal to the clock inputs of a first group of the plurality of storage circuits to perform the write operation for the first group of storage circuits; and a second clock circuit configured to receive the input clock signal and generate a second output clock signal according to a second set of criteria that differs from the first set of criteria, wherein the second clock circuit is configured to provide the second output clock signal to the clock input of a particular storage circuit of a second group of the plurality of storage circuits to perform the write operation for the particular storage circuit.

2. The apparatus of claim 1, wherein the first clock circuit is configured to implement the first set of criteria such that the first output clock signal is provided to each of the first group of storage circuits in response to the input clock signal being active during the write operation addressed to the register; and wherein the second clock circuit is configured to implement the second set of criteria such that the second output clock signal is selectively provided to the particular storage circuit within the second group in response to the input clock signal being active during the write operation addressed to the register.

3. The apparatus of claim 2, wherein the second clock circuit is configured to provide the second output clock signal to the particular storage circuit according to the second set of criteria in response to the bit value of the particular storage circuit being changed by the write operation, and wherein the second clock circuit is configured to clock gate the particular storage circuit in response to the bit value of the particular storage circuit being unchanged by the write operation.

4. The apparatus of claim 3, wherein the second clock circuit is configured to generate one or more additional clock signals for the other storage circuits in the second group, wherein the second clock circuit is configured to provide the additional clock signals to the other storage circuits only in response to the bit values of those storage circuits being changed by the write operation addressed to the register.

5. The apparatus of claim 1, wherein the first and second groups of storage circuits respectively constitute a high-frequency portion and a low-frequency portion of the register, wherein the apparatus is configured to change bit values within the high-frequency portion more frequently than in the low-frequency portion.

6. The apparatus of claim 5, wherein the apparatus is configured to change, during operation, composition of high-frequency and low-frequency portions of the register.

7. The apparatus of claim 1, wherein the register is associated with a pipeline stage of a graphics processing circuit, wherein the plurality of storage circuits are flip-flops, wherein the graphics processing circuit is configured to use a pixel coordinate value stored in the register to operate on a region of pixels, and wherein the graphics processing circuit is configured to process pixels in the region of pixels such that bit values in the second group of storage circuits change less frequently than in the first group of storage circuits.

8. The apparatus of claim 1, further comprising:

a first-in, first-out (FIFO) buffer having a plurality of entries, each having a first portion and a second portion, wherein the register is a particular entry of the plurality of entries, and wherein the first and second portions of the particular entry respectively include the first group of storage circuits and the second group of storage circuits.

9. The apparatus of claim 8, wherein the first clock circuit is configured to provide the first output clock signal to the first group of storage circuits within the first portion of the particular entry in response to an indication that the particular entry is being written to;

wherein the second clock circuit is configured to provide the second output clock signal to the particular storage circuit of the second group within the second portion of the particular entry in response to an indication that the particular entry is being written to with a value that changes current content stored by the particular storage circuit; and wherein the second clock circuit is further configured to provide additional clock signals to one or more of the remaining storage circuits of the second group within the second portion of the particular entry in response to an indication the particular entry is being written to with a value that changes current contents stored by the remaining storage circuits.

10. A method, comprising:

storing a first value in a computer storage element by writing a first set of bit values to a plurality of storage circuits in the storage element, wherein each of the plurality of storage circuits is configured to receive a respective clock input that enables access to that storage circuit, and wherein the plurality of storage circuits includes a first group of storage circuits and a second, different group of storage circuits; and performing an update by writing a second value to the storage element with a second set of bit values, wherein the performing includes:

providing clock inputs for the first group of the plurality of storage circuits according to a first clocking scheme; and providing clock inputs for the second group of the plurality of storage circuits according to a second, different clocking scheme.

11. The method of claim 10, wherein providing the clock inputs for the first group of storage circuits according to a first clocking scheme includes providing an active clock signal to each of the clock inputs of the first group of storage circuits such that respective ones of the second set of bit values are written to the first group of storage circuits; and wherein providing the clock inputs for the second group of the plurality of storage circuits according to the second clocking scheme includes clock gating at least one storage circuit of the second group of storage circuits such that content of the at least one storage circuit is not changed by the update.

12. The method of claim 11, wherein the at least one of the second group of storage circuits is clock gated for the update based on a determination that a bit value being written by the update to the at least one storage circuit is the same as a current value of the at least one storage circuit, and wherein providing the clock inputs for the second group of the plurality of storage circuits according to the second clocking scheme further includes providing an active clock signal to one or more of the second group of storage circuits whose contents are being changed by the update.

13. The method of claim 11, wherein the storing of the first value is performed in a first operating mode, and wherein the method further comprises:

storing a second value in the storage element during a second operating mode in which the first and second groups of storage circuits are constituted differently than in the first operating mode, such that one or more storage circuits that were in the first group of storage circuits during the first operating mode are in the second group of storage circuits during the second operating mode.

14. The method of claim 13, wherein the first and second groups of storage circuits respectively constitute high-frequency and low-frequency portions of the storage element, and wherein a storage circuit that is designated as being in the high-frequency portion of the storage element during the first operating mode is designated as being in the low-frequency portion of the storage element during the second operating mode.

15. The method of claim 11, wherein the first value is a pixel coordinate value, wherein the storage element is within a graphics processing circuit that is configured to use pixel coordinate values stored in the storage element to operate on different regions of pixels, and wherein the clock gating is performed on those ones of the plurality of storage circuits in the storage element that do not change frequently while working with a given region of pixels.

16. An apparatus, comprising:
a storage element having different portions, wherein each of the different portions is comprised of a plurality of storage circuits configured to store respective bit values;
a plurality of clock circuits, each corresponding to one of the portions of the storage element and configured to provide a respective clock signal to storage circuits in that portion of the storage element; and
an enable generation circuit configured to provide, based on a first operating mode for the storage element, enable signals to each of the plurality of clock circuits, wherein the enable signals for the first operating mode specify that storage circuits within a subset of the different portions are clocked on a write operation to the storage element, and further specify that storage circuits within remaining ones of the different portions are selectively clock gated on a write operation to the storage element.

17. The apparatus of claim 16, wherein, during the first operating mode, the subset of the different portions and the remaining ones of the different portions respectively constitute a high-frequency portion and a low-frequency portion of the storage element; and
wherein the enable generation circuit, during a second, different operating mode for the storage element, is configured to provide a different set of enable signals that cause the high-frequency and low-frequency portions of the storage element to be constituted differently.

18. The apparatus of claim 16, wherein the enable generation circuit is configured, during a write operation to the storage element in the first operating mode, to provide a set of enable signals that cause storage circuits within the remaining ones of the different portions to be clock gated in response to the bit values for those storage circuits being unchanged by the write operation.

19. The apparatus of claim 16, wherein the enable generation circuit is configured to generate enable signals for a particular portion of the different portions such that the particular portion is clocked according to a first clocking scheme in a first operating mode and is clocked according to a second, different clocking scheme in a second operating mode.

20. The apparatus of claim 16, wherein the storage element is a bus interface storage element that is configured to store a value to be conveyed on a bus, and wherein the enable generation circuit is configured to generate enable signals according to a current one of a plurality of operating modes for the bus.

* * * * *